US009628356B2

(12) United States Patent
Gintis

(10) Patent No.: US 9,628,356 B2
(45) Date of Patent: Apr. 18, 2017

(54) METHODS, SYSTEMS, AND COMPUTER READABLE MEDIA FOR PROVIDING USER INTERFACES FOR SPECIFICATION OF SYSTEM UNDER TEST (SUT) AND NETWORK TAP TOPOLOGY AND FOR PRESENTING TOPOLOGY SPECIFIC TEST RESULTS

(71) Applicant: Ixia, Calabasas, CA (US)

(72) Inventor: Noah Gintis, Westlake Village, CA (US)

(73) Assignee: IXIA, Calabasas, CA (US)

( * ) Notice: Subject to any disclaimer, the term of this patent is extended or adjusted under 35 U.S.C. 154(b) by 140 days.

(21) Appl. No.: 14/452,205

(22) Filed: Aug. 5, 2014

(65) Prior Publication Data

US 2015/0106670 A1   Apr. 16, 2015

Related U.S. Application Data

(63) Continuation-in-part of application No. 14/051,424, filed on Oct. 10, 2013.

(51) Int. Cl.
*H04L 12/26* (2006.01)
*H04L 12/701* (2013.01)
(Continued)

(52) U.S. Cl.
CPC ........ *H04L 43/045* (2013.01); *G01R 31/3177* (2013.01); *G01R 31/31813* (2013.01);
(Continued)

(58) Field of Classification Search
CPC ....... H04L 43/045; H04L 43/50; H04L 41/12; H04L 45/00; H04L 45/02; H04L 41/0866;
(Continued)

(56) References Cited

U.S. PATENT DOCUMENTS 5,263,029 A * 11/1993 Wicklund, Jr. ........ G11C 29/56
365/201
5,276,789 A * 1/1994 Besaw ................. G06F 17/509
345/440

(Continued)

OTHER PUBLICATIONS

Agilent Technologies, Agilent Triple Play NGN Seminar 2006 Ensuring your Network is Triple-Play Ready, Mar. 22, 2006,Agilent Technologies, pp. 1-159.*

(Continued)

*Primary Examiner* — John J Tabone, Jr.
(74) *Attorney, Agent, or Firm* — Jenkins, Wilson, Taylor & Hunt, P.A.

(57) ABSTRACT

A network equipment test device provides a user interface for user specification of a test traffic source, a test traffic destination, SUT and waypoint topology and one or more test cases. In response to receiving the specified input from the user via the interface, the test traffic source is automatically configured to send the test traffic to the destination via the SUT. The waypoint is automatically configured to measure the test traffic. When the test is initiated, test traffic is sent from the test traffic source to the test traffic destination via the SUT and the at least one waypoint. Test traffic is measured at the waypoint, and traffic measurement results are displayed on a visual map of SUT topology.

21 Claims, 19 Drawing Sheets

(51) Int. Cl.

| | | |
|---|---|---|
| H04L 12/751 | (2013.01) | |
| G06F 11/22 | (2006.01) | |
| G01R 31/319 | (2006.01) | |
| G01R 31/3177 | (2006.01) | |
| G01R 31/3181 | (2006.01) | |
| G01R 31/3185 | (2006.01) | |
| G01R 31/327 | (2006.01) | |
| G11C 29/56 | (2006.01) | |
| H04Q 11/00 | (2006.01) | |
| H04W 24/00 | (2009.01) | |
| H04W 84/00 | (2009.01) | |
| H04L 12/24 | (2006.01) | |

(52) U.S. Cl.
CPC . *G01R 31/31855* (2013.01); *G01R 31/31926* (2013.01); *G01R 31/318538* (2013.01); *G01R 31/318544* (2013.01); *G01R 31/3272* (2013.01); *G06F 11/2294* (2013.01); *G11C 29/56* (2013.01); *H04L 41/12* (2013.01); *H04L 41/22* (2013.01); *H04L 43/50* (2013.01); *H04L 45/00* (2013.01); *H04L 45/02* (2013.01); *H04Q 11/0062* (2013.01); *H04W 24/00* (2013.01); *H04W 84/00* (2013.01); *H04L 41/0866* (2013.01); *H04L 43/0829* (2013.01); *H04L 43/0852* (2013.01)

(58) Field of Classification Search
CPC ............... H04L 41/22; G06F 11/2294; G01R 31/31926; G01R 31/3177; G01R 31/31813; G01R 31/318538; G01R 31/318544; G01R 31/31855; G01R 31/3272; G11C 29/56; H04Q 11/0062; H04W 24/00; H04W 84/00
USPC ....... 714/712, 738, 742, 720, 724, 726, 727; 709/224; 370/254; 324/415; 455/423, 455/67.11; 702/117
See application file for complete search history.

(56) References Cited

U.S. PATENT DOCUMENTS

| | | | | |
|---|---|---|---|---|
| 5,757,820 A * | 5/1998 | Angelotti | ......... | G01R 31/31855 714/738 |
| 6,122,753 A * | 9/2000 | Masuo | ...................... | H04L 1/22 370/216 |
| 6,321,356 B1 * | 11/2001 | Snodgrass | ............... | G11C 29/48 714/738 |
| 6,513,138 B1 * | 1/2003 | Ohsawa | ................ | G01R 31/31926 714/720 |
| 7,154,860 B1 * | 12/2006 | Nanba | .................. | H04L 45/028 370/254 |
| 7,221,912 B2 * | 5/2007 | Nelson | ................ | H04L 41/0206 455/423 |
| 7,272,765 B2 * | 9/2007 | Ichiyoshi | ......... | G01R 31/31830 714/742 |
| 7,370,236 B2 | 5/2008 | Szucs et al. | | |
| 7,500,158 B1 * | 3/2009 | Smith | ................ | H04L 12/2697 709/220 |
| 7,590,903 B2 * | 9/2009 | Volkerink | ........ | G01R 31/31907 365/201 |
| 8,031,623 B2 * | 10/2011 | Beeson | ............. | H04L 29/06027 370/252 |
| 8,086,660 B2 * | 12/2011 | Smith | ................ | H04L 12/2697 703/27 |
| 8,255,749 B2 * | 8/2012 | Swoboda | ......... | G01R 31/31853 714/726 |
| 8,826,088 B2 | 9/2014 | Swoboda | | |
| 9,003,292 B2 * | 4/2015 | Smith | ................ | H04L 12/2697 715/733 |
| 9,246,772 B2 * | 1/2016 | Smith | ................ | H04L 12/2697 |
| 9,356,855 B2 | 5/2016 | Gintis | | |
| 2002/0093961 A1 * | 7/2002 | Sharma | ............... | H04L 41/0806 370/392 |
| 2003/0043745 A1 * | 3/2003 | Kano | ...................... | H04L 45/00 370/238 |
| 2003/0097438 A1 * | 5/2003 | Bearden | ............... | H04L 12/2697 709/224 |
| 2003/0140279 A1 * | 7/2003 | Szucs | .................... | G06F 11/2294 714/31 |
| 2006/0159033 A1 * | 7/2006 | Suzuki | .................... | H04L 45/00 370/254 |
| 2006/0268944 A1 * | 11/2006 | Xu | ...................... | H04Q 11/0062 370/351 |
| 2007/0081549 A1 * | 4/2007 | Cicchetti | ................. | H04L 12/10 370/447 |
| 2007/0081553 A1 * | 4/2007 | Cicchetti | ................. | H04L 12/10 370/466 |
| 2007/0291650 A1 * | 12/2007 | Ormazabal | ......... | H04L 43/0852 370/244 |
| 2008/0162994 A1 | 7/2008 | Szucs et al. | | |
| 2008/0198768 A1 * | 8/2008 | Nanjundaswamy | | H04L 12/2697 370/255 |
| 2008/0201733 A1 * | 8/2008 | Ertugrul | ........... | G06F 17/30867 725/32 |
| 2009/0077163 A1 * | 3/2009 | Ertugrul | ............. | G06Q 30/0273 709/203 |
| 2009/0222694 A1 * | 9/2009 | Adir | ...................... | G06F 17/5022 714/26 |
| 2009/0303880 A1 * | 12/2009 | Maltz | ...................... | H04L 45/02 370/235 |
| 2009/0327903 A1 * | 12/2009 | Smith | .................... | H04L 12/2697 715/737 |
| 2010/0058457 A1 * | 3/2010 | Ormazabal | ......... | H04L 43/0852 726/11 |
| 2010/0074141 A1 | 3/2010 | Nguyen | | |
| 2010/0110883 A1 * | 5/2010 | Russell | .................... | H04L 12/24 370/228 |
| 2010/0204948 A1 * | 8/2010 | Kirrmann | .......... | G01R 31/3272 702/117 |
| 2011/0211473 A1 * | 9/2011 | Matityahu | ............... | H04L 47/10 370/252 |
| 2011/0305168 A1 * | 12/2011 | Koide | ...................... | H04L 41/12 370/255 |
| 2012/0051234 A1 * | 3/2012 | Gintis | ................. | H04L 12/2697 370/250 |
| 2012/0151596 A1 | 6/2012 | McClure et al. | | |
| 2013/0159865 A1 | 6/2013 | Smith et al. | | |
| 2013/0173940 A1 * | 7/2013 | Sargent | .................... | H04L 12/10 713/310 |
| 2013/0305091 A1 | 11/2013 | Stan et al. | | |
| 2013/0311646 A1 * | 11/2013 | Nikaido | ................ | G06Q 10/20 709/224 |
| 2013/0329572 A1 * | 12/2013 | Gintis | .................... | H04L 43/026 370/244 |
| 2014/0098824 A1 * | 4/2014 | Edmiston | ............... | H04L 12/56 370/412 |
| 2014/0115421 A1 * | 4/2014 | Cai | ...................... | G06F 11/0754 714/758 |
| 2014/0269386 A1 * | 9/2014 | Chu | ...................... | H04L 41/145 370/252 |
| 2014/0269390 A1 * | 9/2014 | Ciodaru | ................... | H04L 43/50 370/252 |
| 2014/0321285 A1 * | 10/2014 | Chew | ...................... | H04L 47/24 370/236 |
| 2014/0341052 A1 | 11/2014 | Devarasetty et al. | | |
| 2015/0003259 A1 * | 1/2015 | Gao | ........................ | H04L 45/18 370/244 |
| 2015/0106669 A1 * | 4/2015 | Gintis | ................... | H04L 43/50 714/712 |
| 2015/0106670 A1 * | 4/2015 | Gintis | ................... | H04L 43/045 714/712 |

OTHER PUBLICATIONS

David Jörg, Ants-Based Routing in Mobile Ad-Hoc Networks, 2004, Diplomarbeit der Philosophisch-naturwissenschaftlichen Fakultät der Universität Bern, pp. 1-89.*

(56) References Cited

OTHER PUBLICATIONS

Haris, Abdullah, A DTN Study: Analysis of Implementations and Tools, 2010, Technical University of Denmark, pp. 1-86.*

Non-Final Office Action for U.S. Appl. No. 14/051,424 (Mar. 25, 2015).

Han et al., "Star Topology Test Architecture for Multi-site Testing," IEEE, pp. 1-5 (Jun. 27, 2012).

Poretsky et al., "Benchmarking Methodology for Link-State IGP Data Plane Route Convergence," draft-ietf-bmwg-igp-dataplane-conv-meth-21, Network Working Group, pp. 1-28 (May 10, 2010).

Commonly-assigned, co-pending U.S. Appl. No. 14/051,424 for "Methods, Systems, and Computer Readable Media for Providing for Specification or Autodiscovery of Device Under Test (DUT) Topology Information," (Unpublished, filed Oct. 10, 2013).

Notice of Allowance and Fee(s) Due for U.S. Appl. No. 14/051,424 (Feb. 1, 2016).

Advisory Action Before the Filing of an Appeal Brief for U.S. Appl. No. 14/051,424 (Dec. 1, 2015).

Notification of Transmittal of the International Search Report and the Wiitten Opinion of the International Searching Authority, or the Declaration for International Application No. PCT/US2015/041633 (Nov. 4, 2015).

Final Office Action for U.S. Appl. No. 14/051,424 (Aug. 20, 2015).

\* cited by examiner

| FLOW | DUT1 | DUT2 | DUT3 | DUT4 | DUT5 | DUT6 | DUT7 | B-TO-B | FULL PATH |
|---|---|---|---|---|---|---|---|---|---|
| A-X | 50/50 | 49/50 | 47/50 | 2/0 | 47/50 | 0/0 | 0/0 | 0/0 | 49/50 |
| B-Y | 0/0 | 0/0 | 0/0 | 0/0 | 0/0 | 50/50 | 49/50 | 0/0 | 48/50 |
| C-Z | 0/0 | 0/0 | 0/0 | 0/0 | 0/0 | 0/0 | 0/0 | 50/50 | 50/50 |

FIG. 4

METHODS, SYSTEMS, AND COMPUTER READABLE MEDIA FOR PROVIDING USER INTERFACES FOR SPECIFICATION OF SYSTEM UNDER TEST (SUT) AND NETWORK TAP TOPOLOGY AND FOR PRESENTING TOPOLOGY SPECIFIC TEST RESULTS

PRIORITY CLAIM

This application is a continuation-in-part of U.S. patent application Ser. No. 14/051,424 filed Oct. 10, 2013; the disclosure of which is incorporated herein by reference in its entirety.

TECHNICAL FIELD

The subject matter described herein relates to testing network equipment. More particularly, the subject matter described herein relates to methods, systems, and computer readable media for providing user interfaces for specification of system under test (SUT) and network tap topology and for presenting topology specific test results.

BACKGROUND

In network lab testing environments, network equipment test devices are connected to single or multiple devices under test (DUTs). A network that includes multiple DUTs is often referred to as a system under test (SUT). In some tests, the network equipment test devices send packets to the DUTs, receive packet from the DUTs, and generate statistics based on the received packets.

Currently, network equipment test devices allow topology information to be specified about the network equipment test devices themselves. However, the SUT is treated as a black box by current network equipment test devices. That is, current network equipment test devices do not allow the specification of topology information associated with the SUT. Accordingly, the test administrator is required to manually interpret received packets statistics to identify configuration errors associated with the SUT. In light of the voluminous nature of network test data, such manual interpretation is undesirable.

In addition to specifying the topology of the SUT, it is desirable for the user to be able to define tap points which may be the DUTs themselves or links between the DUTs. Network taps are devices that either passively copy or generate measurements based on packets transmitted through a network while allowing the original packets to proceed to their destinations. In order to properly configure a test, taps must be configured to measure or copy only traffic that is of interest to the user for a specific test. Performing such configuration manually can be cumbersome, especially when the number of taps is large. In addition, if a large number of taps are used in a particular test, a large number of packets will be measured or copied and analysis of measurements from multiple different sources may be difficult. Accordingly, there exists a need for methods, systems, and computer readable media for providing user interfaces for specification of SUT and network tap topology and for presenting topology specific test results.

SUMMARY

A network equipment test device provides a user interface for user specification of a test traffic source, a test traffic destination, SUT and waypoint topology and one or more test cases. In response to receiving the specified input from the user via the interface, the test traffic source is automatically configured to send the test traffic to the destination via the SUT. The waypoint is automatically configured to measure the test traffic. When the test is initiated, test traffic is sent from the test traffic source to the test traffic destination via the SUT and the at least one waypoint. Test traffic is measured at the waypoint, and traffic measurement results are displayed on a visual map of SUT topology.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which:

FIG. 4 is a table illustrating exemplary SUT-topology-specific test results that may be generated by a network equipment test device according to an embodiment of the subject matter described herein;

DETAILED DESCRIPTION

Figure 1:
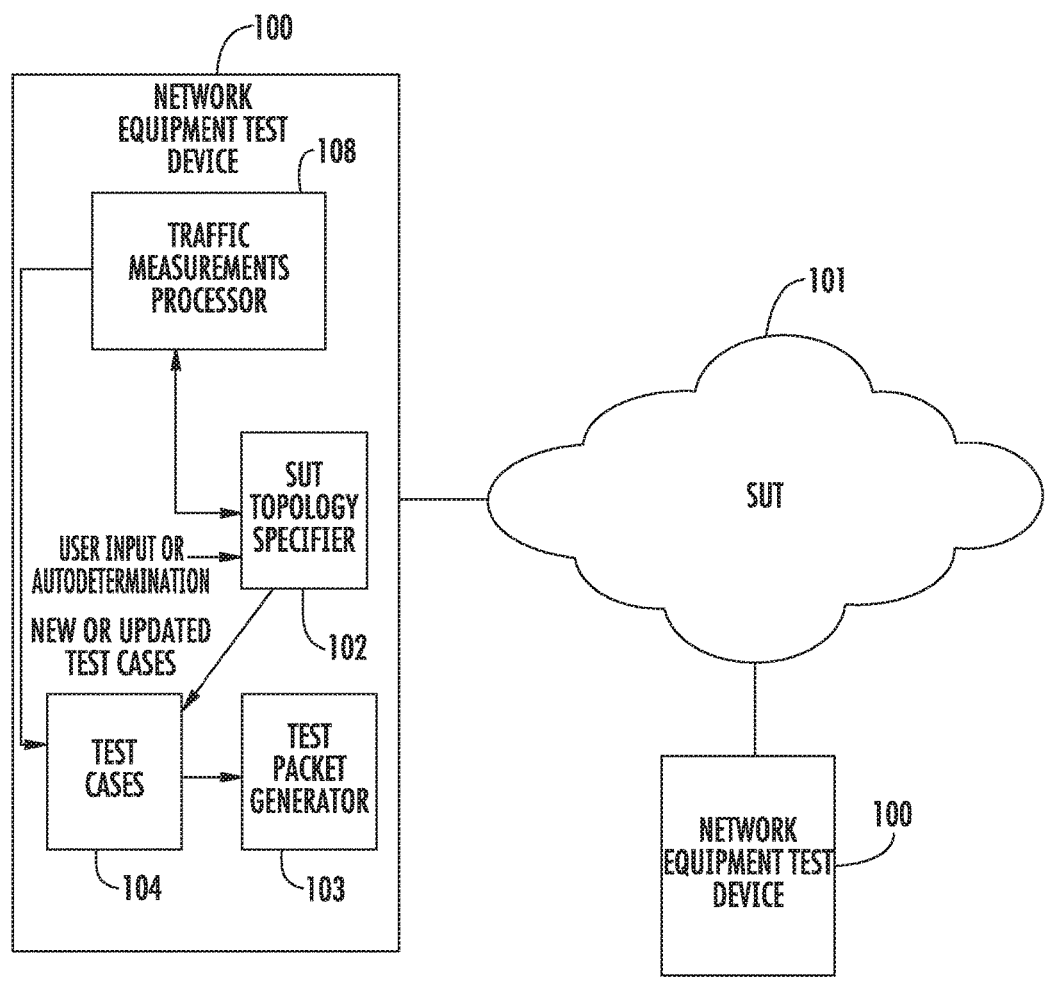
FIG. 1 is a block diagram illustrating a lab test environment where two network equipment test devices are configured to test one or more DUTs according to an embodiment of the subject matter described herein.

The subject matter described herein relates to methods, systems, and computer readable media for providing user interfaces for specification of SUT and network tap topology and for presenting topology specific test results. FIG. 1 is a block diagram illustrating an exemplary lab test environment where network equipment test devices are configured to test one or more DUTs that form a SUT. Referring to FIG. 1, network equipment test devices 100 may be configured as source and destination, respectively, to test one or more DUTs that form a SUT 101. In the illustrated example, SUT 101 appears as a cloud, which is the way that DUTs are currently visualized on the graphical user interfaces of network equipment test devices 100. Because topology information associated with SUT 101 may be important in visualizing test results, analyzing test results, and configuring subsequent tests, each network equipment test device 100 may include a SUT topology specifier 102 that allows the user to specify SUT topology information and/or automatically discovers SUT topology information. For example, a user may input data regarding the configuration of SUT 101. SUT topology specifier 102 may store this information. In an alternate implementation, SUT topology specifier 102 may automatically discover SUT topology information, for example, by sending topology discovery packets, such as packet Internet groper (PING), address resolution protocol (ARP), or simple network management protocol (SNMP) packets to SUT 101 to determine topology information associated with SUT 101. In yet another alternate implementation, SUT topology specifier 102 may receive user input regarding SUT topology, use autodiscovery to determine the actual topology, compare the actual topology to the user input topology, and report results of the comparison to the user. For example, SUT topology specifier 102 may report graphically any differences between the user input topology and the autodiscovered topology.

Once SUT topology information has been specified, either through user input or autodiscovery and the user starts a test, a test packet generator 103 generates and sends test packets to SUT 101 based on test cases 104. Because SUT topology information has been specified, when packets or corresponding traffic measurements are received by traffic measurements processor 108, the topology information can be used to generate SUT-topology-specific test results. Examples of SUT topology-specific test results include DUT coverage by a test, link coverage by a test, and packet statistics on a per link and/or per DUT basis. The SUT-topology-specific test results may also be used to generate new test cases and/or reconfigure existing test cases. For example, if a test indicates that a particular DUT in the SUT topology fails to forward packets, additional test cases may be created for this DUT.

Figure 2:
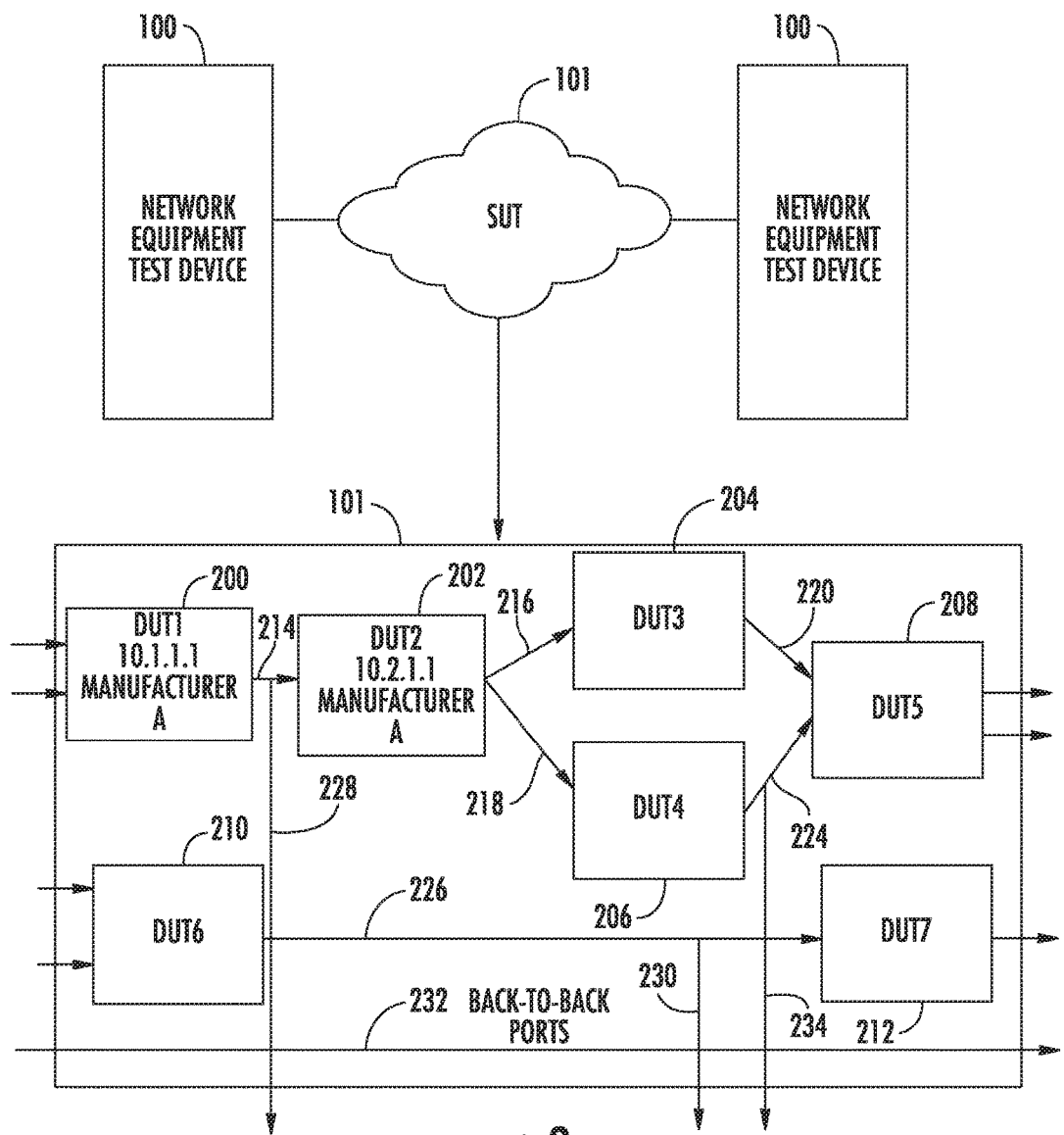
FIG. 2 is a block diagram illustrating exemplary specification of SUT topology information that may be performed by one or both of the network equipment test devices in FIG. 1.

FIG. 2 is an example of SUT topology information that may be specified for the cloud illustrated in FIG. 1. Referring to FIG. 2, SUT cloud 101 may be editable by the user via a graphical user interface provided by SUT topology specifier 102. Thus, FIG. 2 is an example of a graphical user interface that SUT topology specifier 102 may present to the user. SUT cloud 101 may be a selectable and editable graphical user interface element. When the user selects SUT cloud 101, SUT topology specifier 102 may allow the user to define DUTs and interconnections between DUTs. In the illustrated example, the use has defined devices under test 200, 202, 204, 206, 208, 210, and 212. The user is also enabled to input interconnections 214, 216, 218, 220, 224, and 226 between the DUTs. The user is further enabled to specify the location of tap points 228, 230, and 234 that represent packet capture or measurement points between the DUTs. The user is further enabled to specify back to back ports 232, which are ports of network equipment test devices 100 that are connected to each other. Back to back ports may be used to verify the functionality of network equipment test devices 100. The user is further enabled to specify names associated with each device under test, i.e., "DUT1". The user is further enabled to specify IP address information and manufacturers associated with the DUTs. In the illustrated example, the user has defined two of the DUTs as Manufacturer A DUTs and has specified IP addresses for the Manufacturer A DUTs.

As described above, once DUT topology information is specified, the DUT topology information can be used to visualize and/or analyze test results. For example, test packet generator 103 may transmit test packets to a device under test. Traffic measurements processor 108 may receive packets or corresponding traffic measurements from the system under test and/or waypoints defined in the system under test and determine, using the stored topology information, which links between the devices under test were covered by the test. Traffic measurements processor 108 may generate a diagram, similar to that illustrated in FIG. 2 that shows visually, which links were traversed by the test packets. Traffic measurements processor 108 may highlight any links or DUTs that are not traversed in a test for subsequent testing.

Figure 3A:
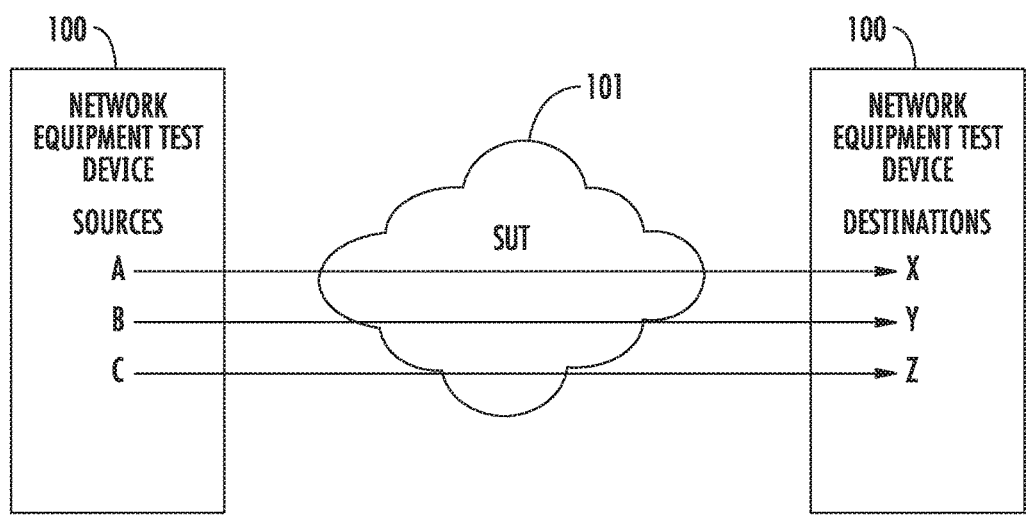
FIG. 3A is a block diagram illustrating exemplary specification of source and destination information by a network equipment test device.
Figure 3B:
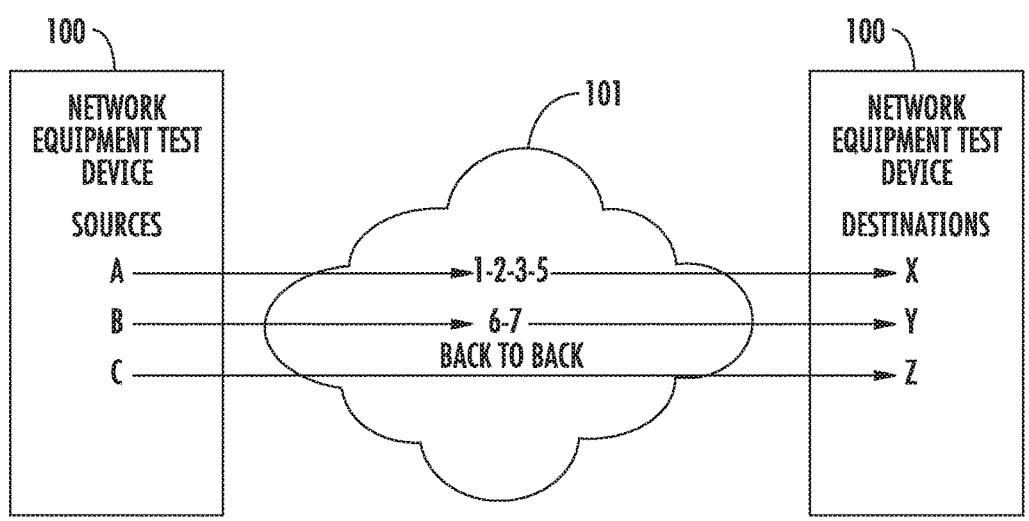
FIG. 3B is block diagram illustrating specification of a path through DUTs using SUT topology information according to an embodiment of the subject matter described herein.

In another example, as illustrated in FIGS. 3A and 3B, SUT topology specifier 102 may provide for user specification of the path through a network of devices under test through which packets will travel during a test and may store the associated test case in memory of network equipment test device 100. For example, FIG. 3A illustrates the conventional specification of packet destinations without specifying a path through the devices under test. However, once system under test topology information is known, the test administrator can specify, using the system under test topology information, a path through the system under test. In FIG. 3B, packets from source A to destination X will pass through devices under test 1-5. Packets from source B to destination Y will traverse devices under test 6 and 7. Packets from source C to destination Z will be transmitted over a back to back connection. SUT topology specifier 102 may provide a test case edit mode where the user graphically defines the paths of packets through a network of devices under test, using an interface similar to that illustrated in FIG. 3B. Once the user defines the paths through the system under test, SUT topology specifier 102 may create and store the corresponding test case for later execution by network equipment test device 100.

It should be noted that network equipment test device 100 and its components and functionality described herein constitute a special purpose test device that improves the technological field of testing network devices by providing for user specification of SUT and tap topology, automatic configuration of taps to detect traffic of interest, and display of SUT-topology-specific test results.

As stated above, traffic measurements processor 108 may utilize the SUT topology information to generate SUT-topology-specific test results. FIG. 4 is a table illustrating an example of SUT-topology-specific test results that may be generated by traffic measurements processor 108 using the SUT topology information. Referring to FIG. 4, the table indicates that for a flow from source A to destination X, the number of packets received and the number of packets expected at different points in the device under test topology. For example at DUT 1, 50 packets were received and 50 packets were expected. For the same flow, at DUT 2, 49 packets were received and 50 were expected, indicating that one packet was lost before DUT 2. At DUT 3, 47 packets were received and 50 were expected, indicating a loss of 3 packets before DUT 3. At DUT 4, two packets were expected and zero packets were received, indicating a loss of two packets before DUT 4. For the full path, 49 packets were received and 50 were transmitted, indicating one packet lost for the entire test. For the A-X packet flow, it can be seen from the table illustrated in FIG. 4 that only one packet did not make it completely through the test. However, the topology information allows the user to determine that a certain number of packets did not proceed along their expected paths through the network of devices under test. As will be described in more detail below, measurements, such as latency and packet loss, may be presented on a per-DUT or per-link basis.

Returning to FIG. 3B, for the B-Y flow, packets are only expected to traverse DUTs 6 and 7. In the topology illustrated in FIG. 2, the path from the source network equipment test device 100 to the destination network equipment test device 100 through DUTs 6 and 7 does not traverse any other DUTs. Thus, in FIG. 4, for the B-Y flow, the expected packets at DUTs 1-5 are all zero, as all of the packets should traverse DUTs 6 and 7 only. Similarly, for the C-Z flow, the packets are expected to only traverse the back to back connection between network equipment test devices 100, the expected packets at each DUT are zero in the table illustrated in FIG. 4. The actual number of packets that traverse the back to back connection is equal to the expected number of packets, indicating that the back to back connection works correctly for the particular flow used in the test.

In another example of SUT-topology-specific test results, traffic measurements processor 108 may generate latency graphs as a function of location in the SUT topology. For example, a latency graph may be generated showing the average latency on each link 214, 216, 218, 220, 224, and 226 illustrated in FIG. 2.

As stated above, the SUT-topology-specific test results may be used to generate new test cases or update existing test cases. Such generation may be performed dynamically by traffic measurements processor 108 during a test or statically by a test administrator using the interface provided by SUT topology specifier 102 after viewing SUT-topology-specific test results. In the automated case, traffic measurements processor 108 may determine that a particular test is not covering all of the DUTs in the topology and may modify the test during execution of the test to send packets to the DUT that was initially not covered by the test. Such a modification may also be performed manually by the test administrator after viewing test results. In another example, if the test results indicate that a particular device under test is causing packet loss for packets over a certain size, traffic measurements processor 108 may reduce the packet size of packets sent to the DUT until the packets pass the DUT.

In another example, if the SUT-topology-specific test results indicate that all packets are being transmitted over one link but no packets are being transmitted over another link through which packets are expected to be transmitted, it may be desirable to review the cabling between the network equipment test devices and the devices under test to determine whether a cable misconfiguration has occurred before running subsequent tests.

Figure 5:
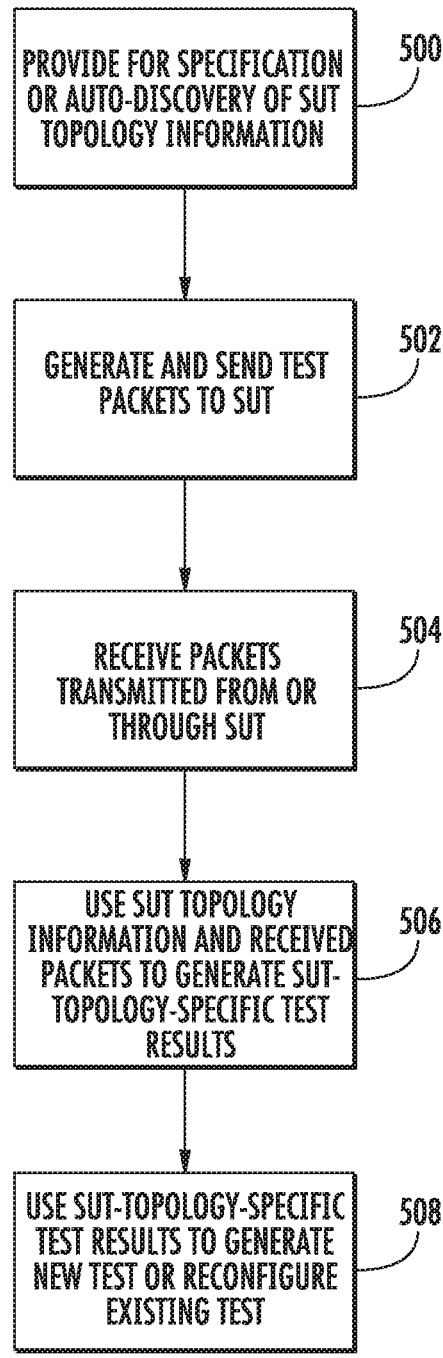
FIG. 5 is a flow chart illustrating an exemplary process for specifying or autodiscovering and utilizing SUT topology information according to an embodiment of the subject matter described herein.

FIG. 5 is a flow chart illustrating exemplary overall steps for specifying and utilizing device under test topology information according to an embodiment of the subject matter described herein. Referring to FIG. 5, in step 500, the method includes providing for the specification or autodiscovery of SUT topology information. As stated above, providing for the specification of SUT topology information may include allowing the user to input DUT topology information via a graphical user interface, similar to that illustrated in FIG. 2. Automatically discovering device under test topology information may include generating and sending topology discovery messages, such as ARP, SNMP, or PING messages, to the DUTs. In step 502, test packets are transmitted to the system under test. The test packets may be part of a device under test link coverage test, an MTU size test, or any suitable test. Because SUT topology information is known, transmitting the test packets may include specifying, on a per packet flow basis, a path through the DUTS, as illustrated in FIG. 3B.

In step 504, packets are received from the system under test. The packets may be packets that were transmitted by or through the devices under test. In step 506, the method includes generating SUT-topology-specific information from the test results. An example of such information is illustrated in FIG. 4. In step 508, the SUT-topology-specific test results are used to reconfigure a test or to generate a new test. For example, if the test results indicate lack of coverage on a particular inter-DUT link, a subsequent test may be structured to test that link. In another example, if packet loss is occurring at a particular device under test, additional testing directed to that device under test may be generated.

Although in the examples above, packets are described as being received from the DUTs, it is understood that packets transmitted from or through the DUTs could be collected by network taps, such as the network taps illustrated in FIG. 2, and provided by the taps to the network equipment test device or to memory accessible to the network equipment test device. In one embodiment, the network taps may be one or more network tool optimizer devices with at least one network port that receives packets transmitted from or through the devices under test and at least one tool port that forwards the packets to the network equipment test device. In addition, although the SUT topology specifier is shown as being a component of the network equipment test device, it is understood that the SUT topology specifier 102 may reside in whole or in part on an administrative terminal that has access to the network equipment test device to configure its test cases and/or interpret test results.

Figure 6A:
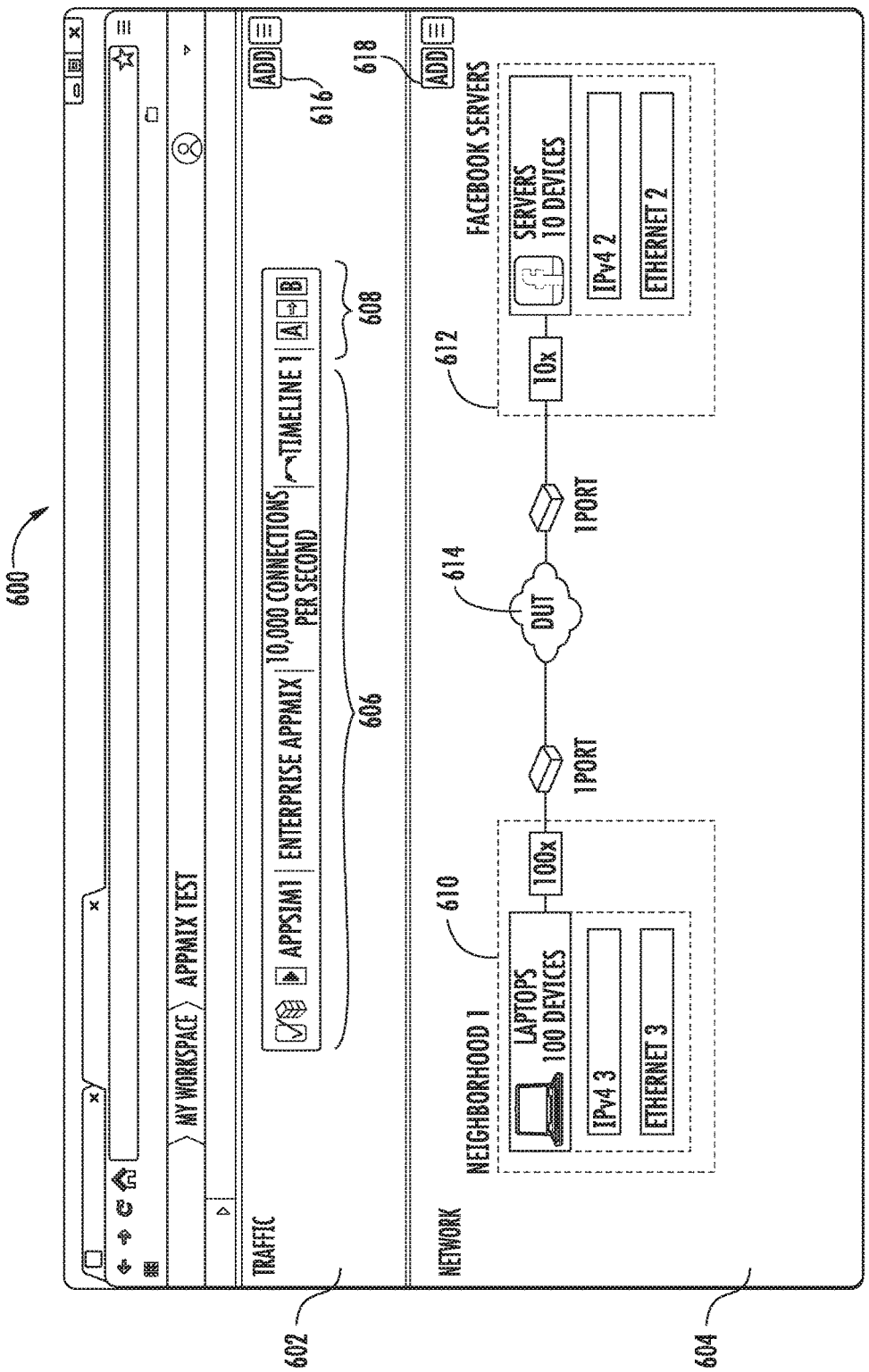
FIGS. 6A-6C are computer screen shots of an exemplary user interface for specifying traffic source and destination information associated with a network equipment test.
Figure 6B:
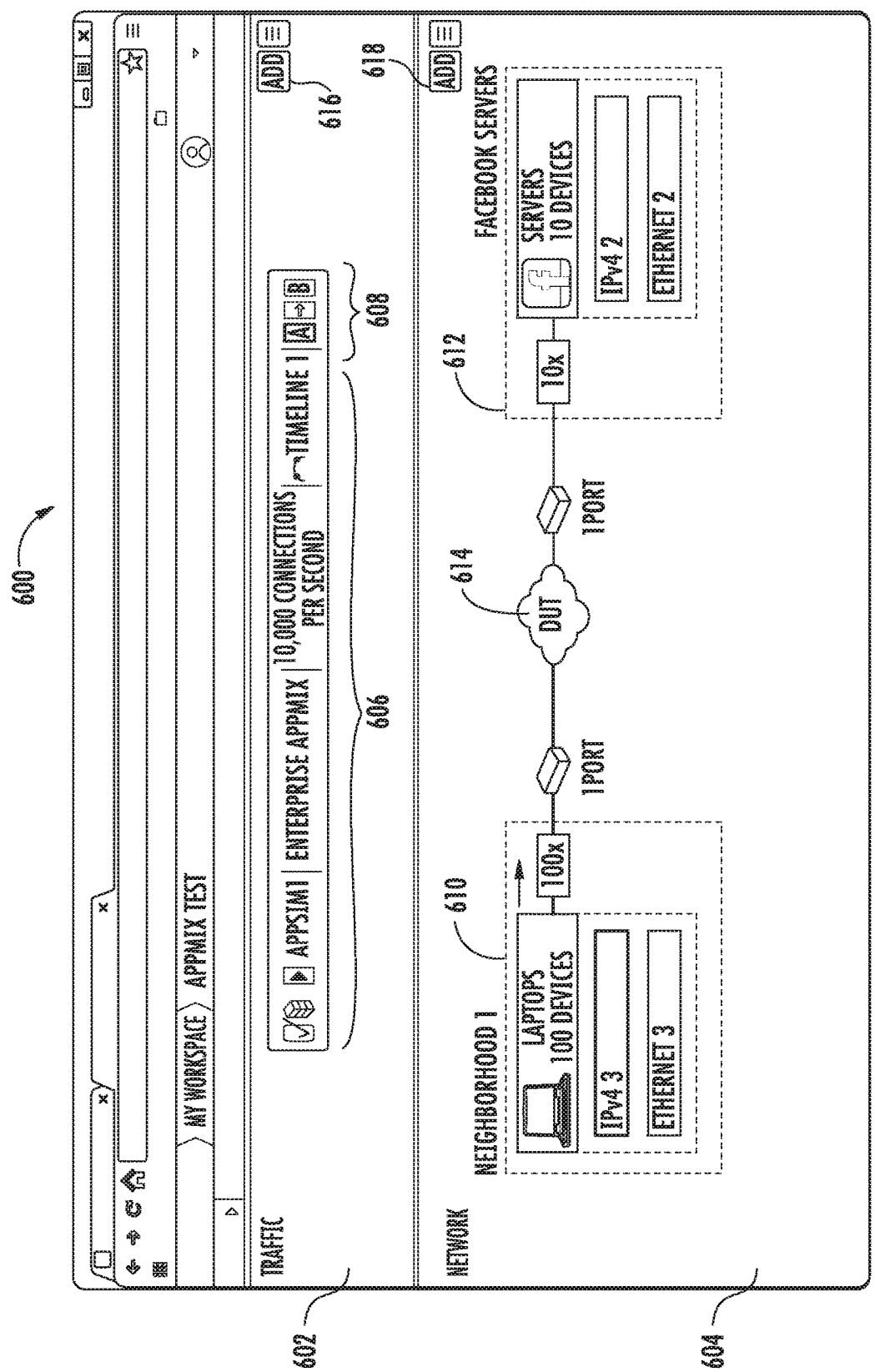
Figure 6C:
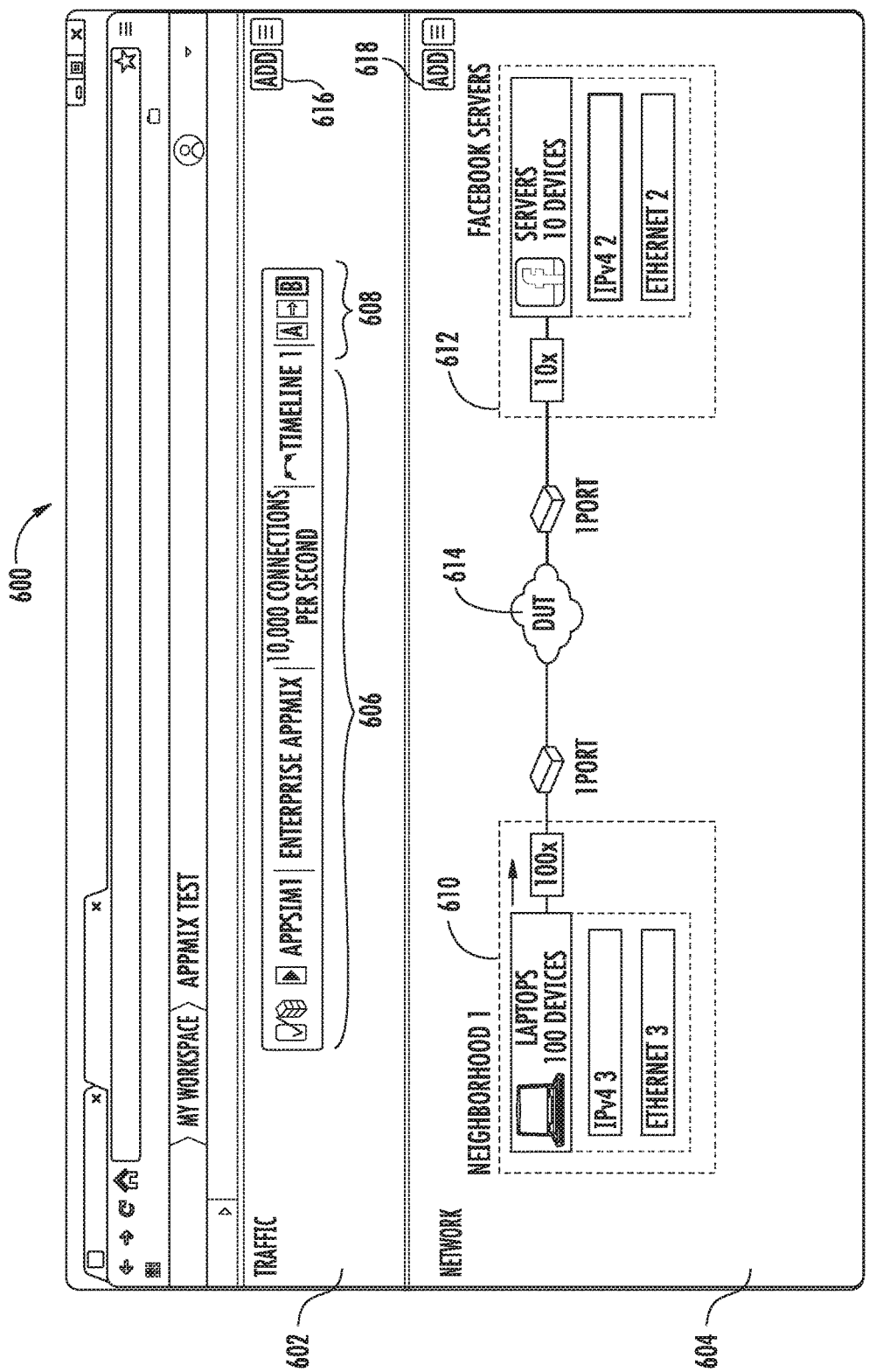

FIGS. 6A-6C illustrate a user interface that may be presented by SUT topology specifier 102 for defining a traffic source and a traffic destination according to an embodiment of the subject matter described herein. Referring to FIG. 6A, the user interface 600 includes a traffic definition portion 602 and a control plane definition and display portion 604. Traffic definition portion 602 provides for user specification of a type of traffic, a traffic volume, and a timeline for the traffic. In the illustrated example, the user has selected traffic to be generated a mix of simulated enterprise applications. With regard to traffic rate, traffic definition portion 602 provides for user specification of a number of connections per second to be initiated with or through the SUT. With regard to timeline, traffic definition portion 602 provides for user specification of a profile for ramping traffic up to the specified number of connectors per second, a time for maintaining the specified number of connections per second, and a time for ramping the specified number of connections per second down as the test concludes.

Traffic definition portion 602 further includes an interface where the user can specify a traffic source and a traffic destination, as well as intermediate points between the traffic source and the destination. In the illustrated example, A is referred to as the traffic source, and B is the traffic destination. Intermediate points are not shown in FIG. 6A because there are no devices under test shown. Traffic definition portion 602 may also provide for user specification of waypoints where traffic is measured. In FIG. 6A, the user can add different traffic types via an add button 616. Similarly, a user can add nodes to the network topology via add button 618.

Control plane definition and display portion 604 displays network endpoints 610 and 612 and system under test 614. In the illustrated example, the network endpoints include 100 laptops running IPv4 over Ethernet and 10 Facebook servers running IPv4 over Ethernet. The topology of system under test 614 is not specified in FIG. 6A.

FIG. 6B illustrates how interface 600 provides for user selection of a traffic source. In FIG. 6B, the user selects "A" in traffic definition portion 602 and then selects the corresponding node for the traffic source in control plane definition and display portion 604. In the illustrated example, the user selects laptops 610 as the traffic source or "A" nodes.

FIG. 6C illustrates providing for user specification of the traffic destination. In the illustrated example, the user selects "B" in traffic definition portion 602 and then selects the node in control plane definition and display portion 604 for the traffic destination. In the illustrated example, the user selects Facebook servers 612 as the traffic destination.

Figure 7A:
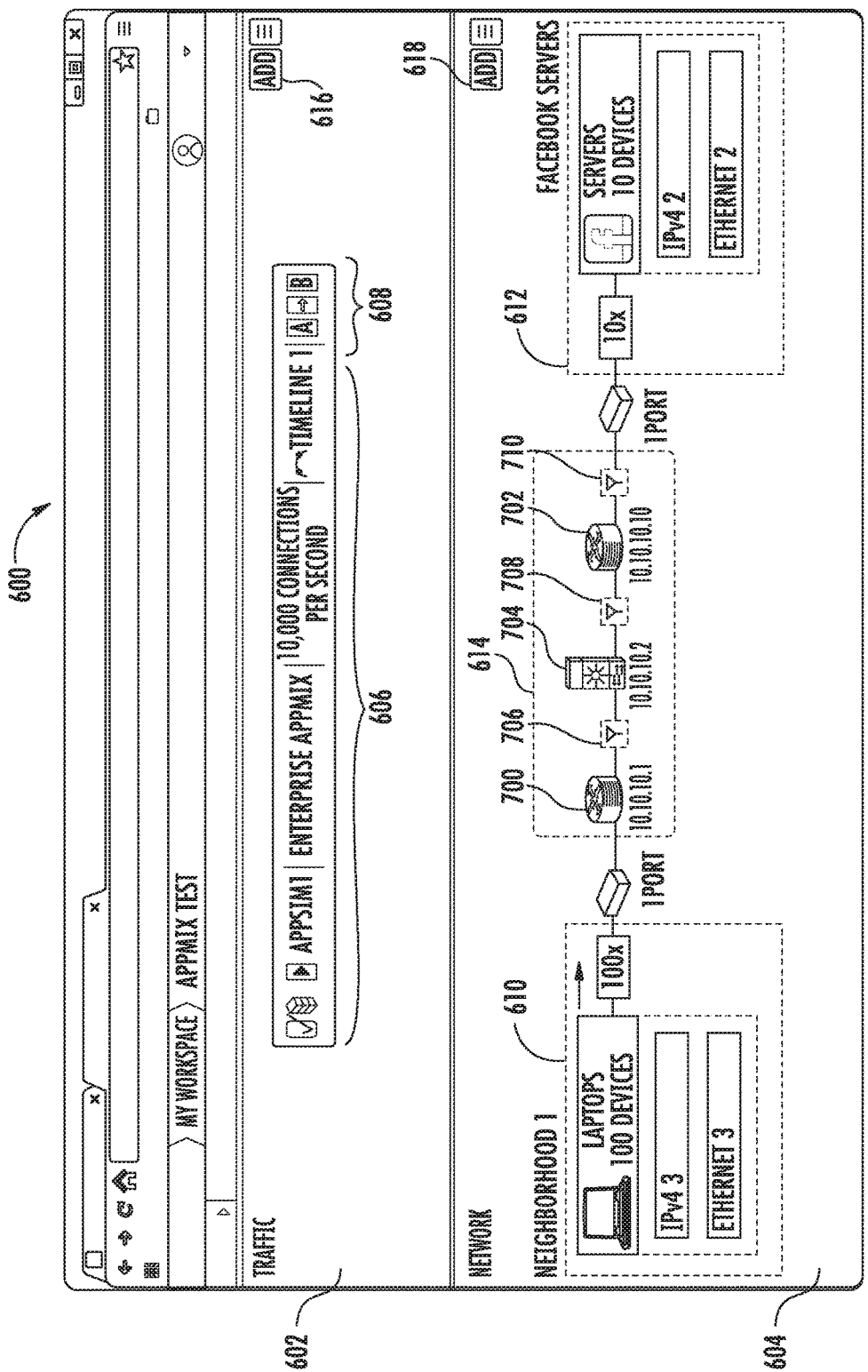
FIGS. 7A-7G are computer screen shots of the user interface illustrated in FIGS. 6A-6C for specifying topology information of network taps and the system under test according to an embodiment of the subject matter described herein.

FIG. 7A illustrates an example of how SUT topology specifier 102 may provide for user specification of the system under test and tap topology according to an embodiment of the subject matter described herein. In the illustrated example, the user defines SUT 614 to include routers 700, 702, and 704 and network taps 706, 708, and 710. The user adds nodes and waypoints or tap points to the system under test using add button 618. The user may also specify the interconnections between the devices under test using add button 618 to add the interconnections and then graphically connect the devices under test using the added interconnections.

Figure 7B:
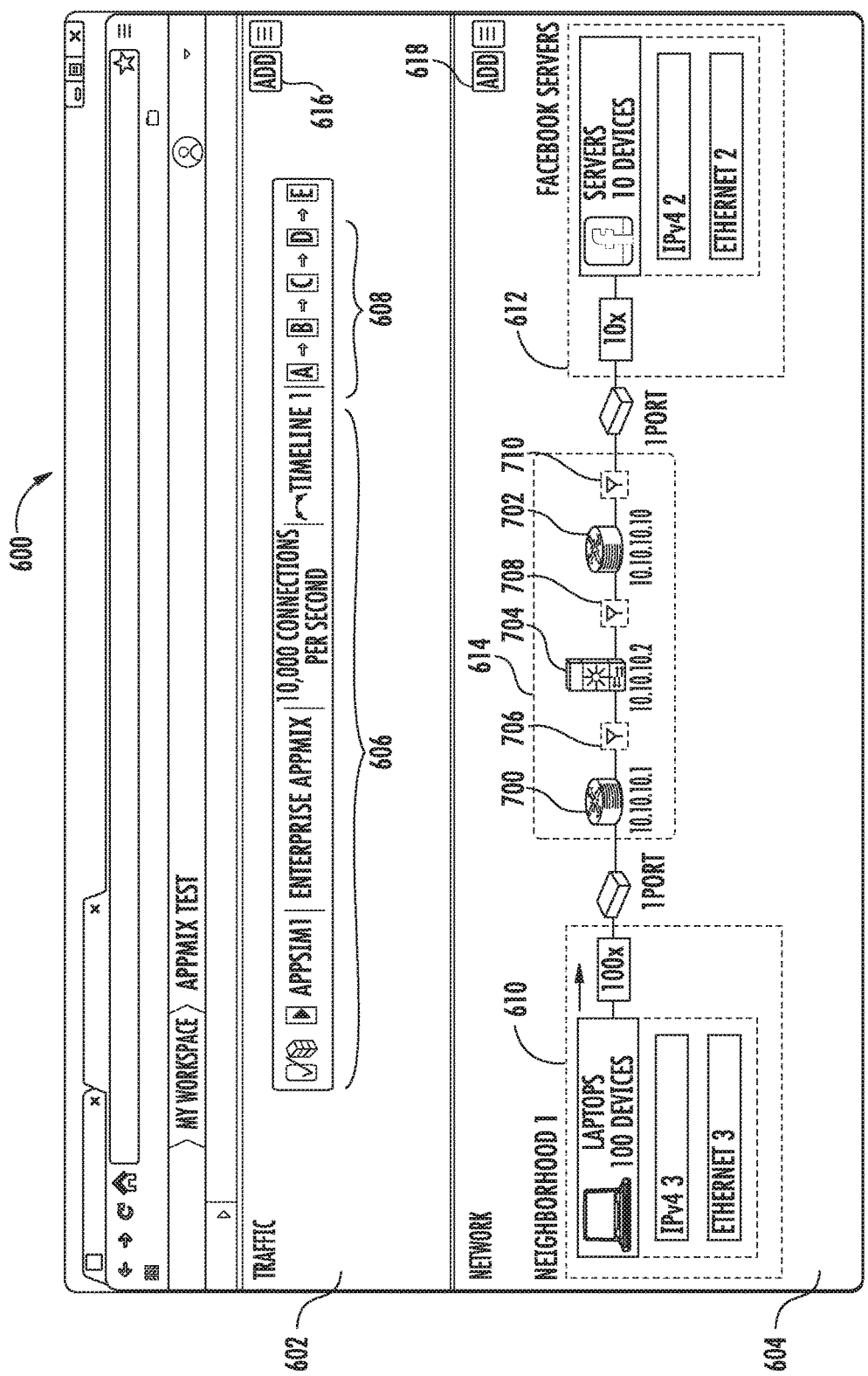
Figure 7C:
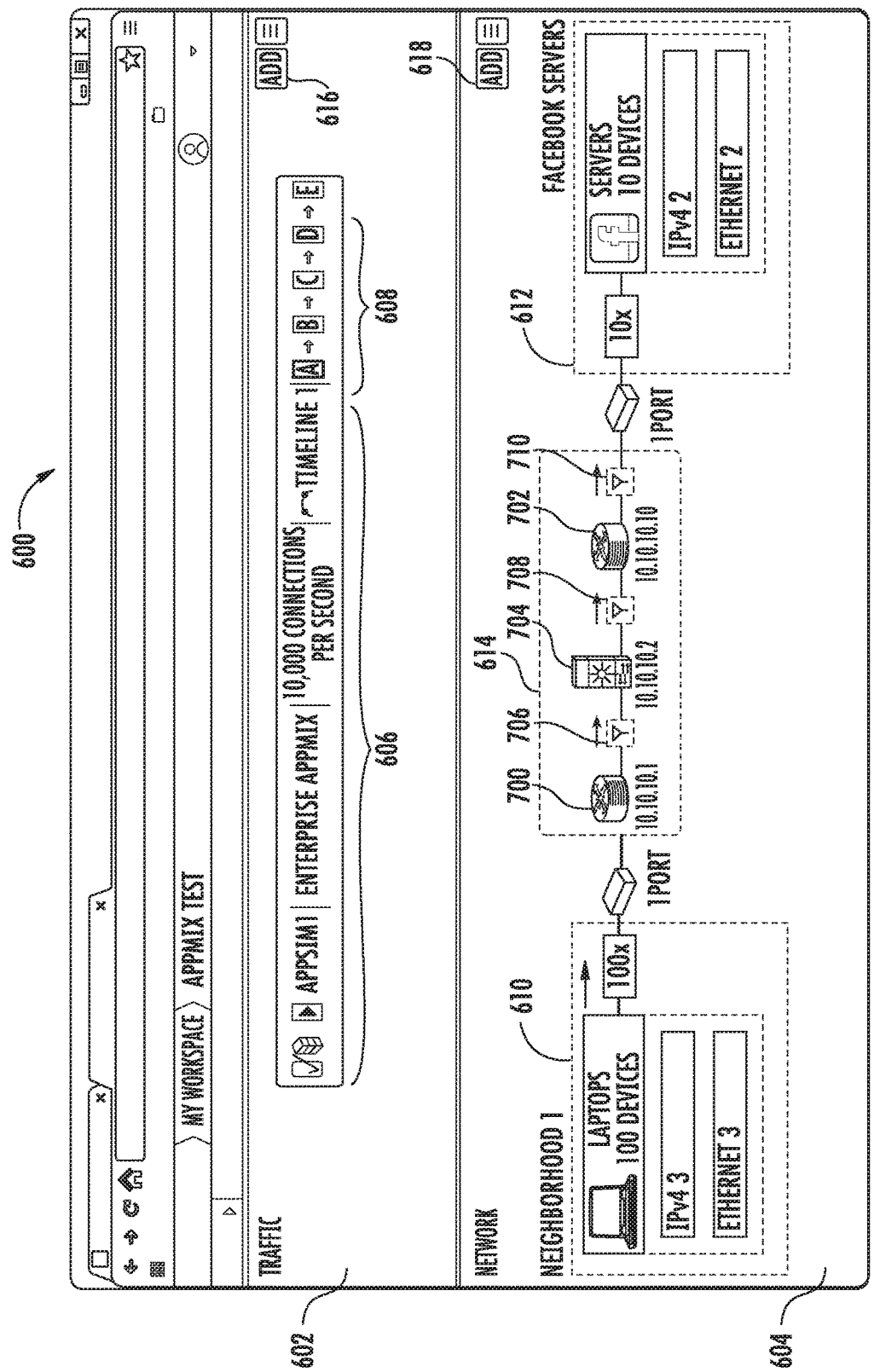

Once the user has specified the topology network using control plane definition and display portion 604, the user can define which nodes are traffic sources, which nodes are traffic destinations, as well as the locations of the waypoints. In FIG. 7B, traffic definition portion 602 displays A, B, C, D, and E nodes corresponding to the number of nodes displayed in control plane definition and display portion 604. In the illustrated example, traffic definition portion 602 displays five nodes corresponding to nodes 610 and 612 and tap points 706, 708, and 710. The displayed A, B, C, D, and E nodes can then be associated with the corresponding nodes displayed in control plane definition and display portion 604.

Figure 7D:
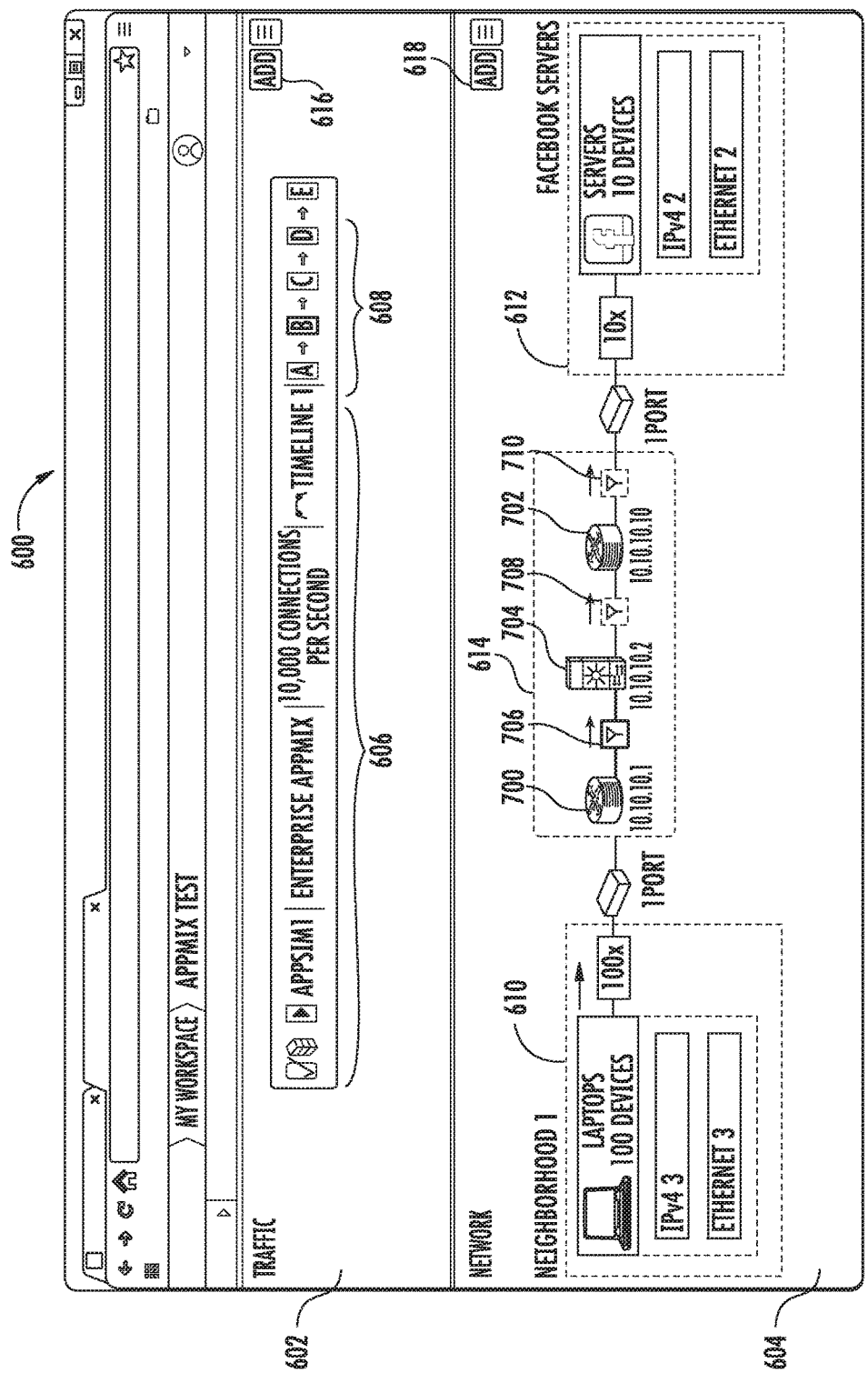
Figure 7E:
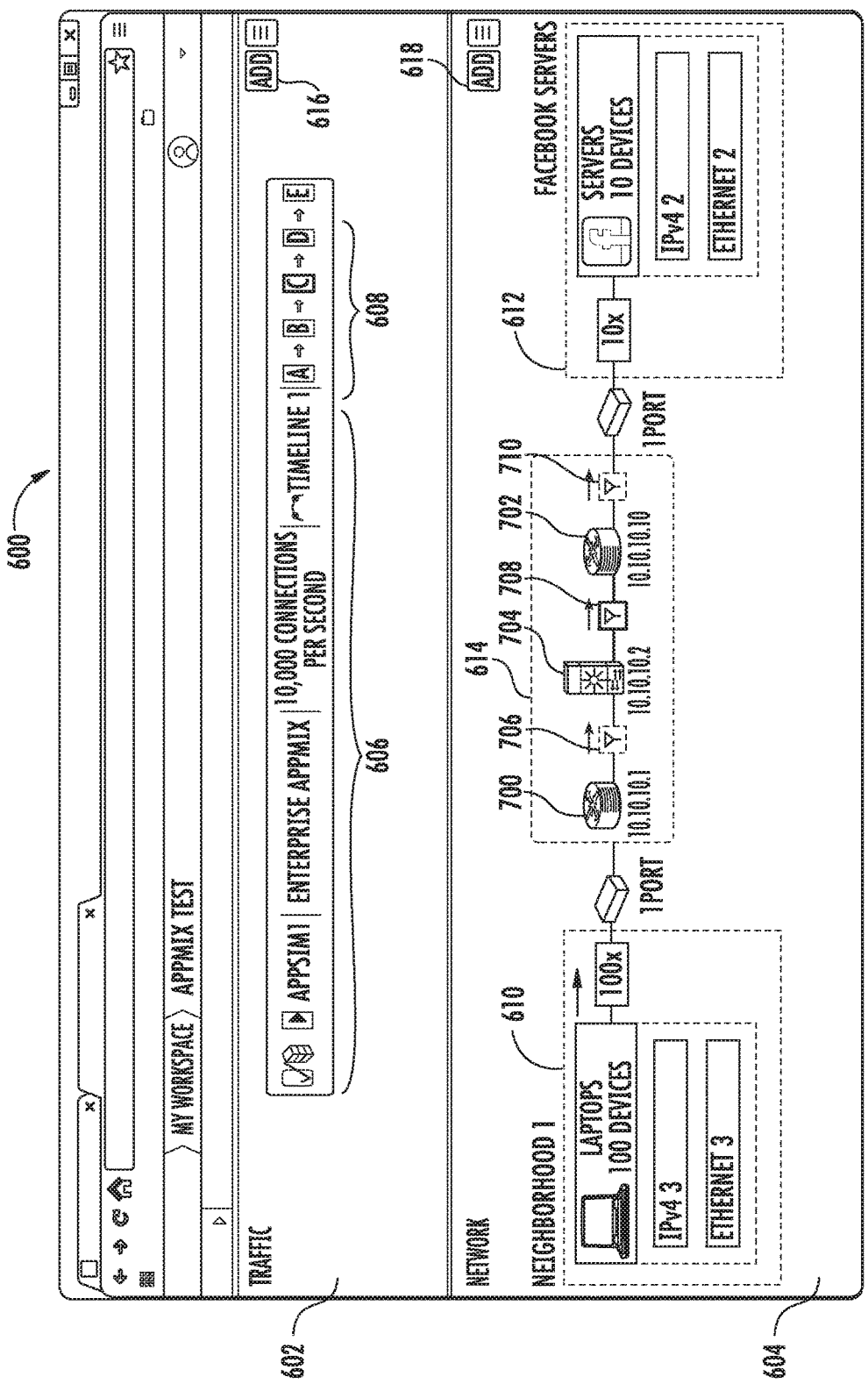
Figure 7F:
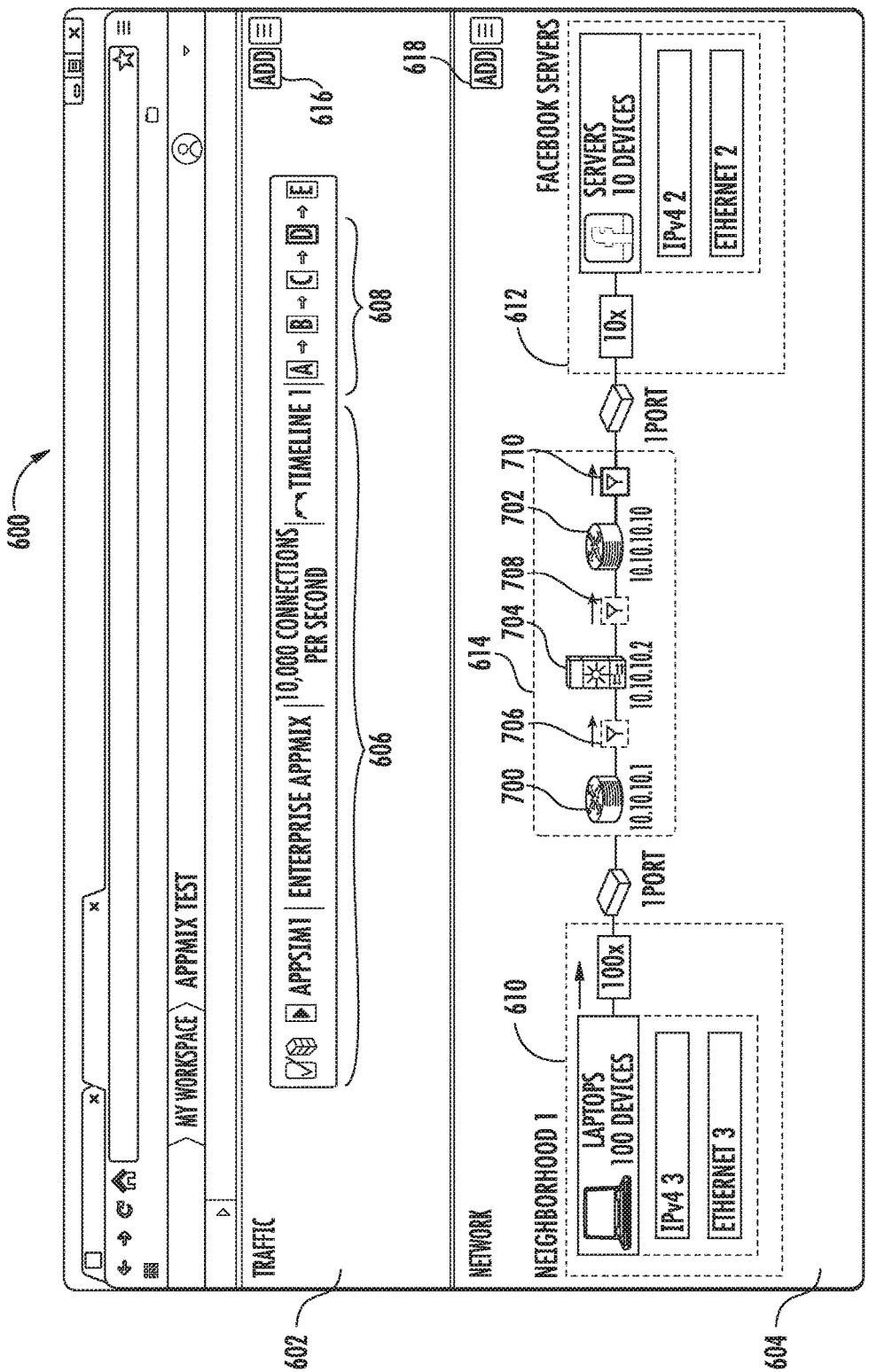
Figure 7G:
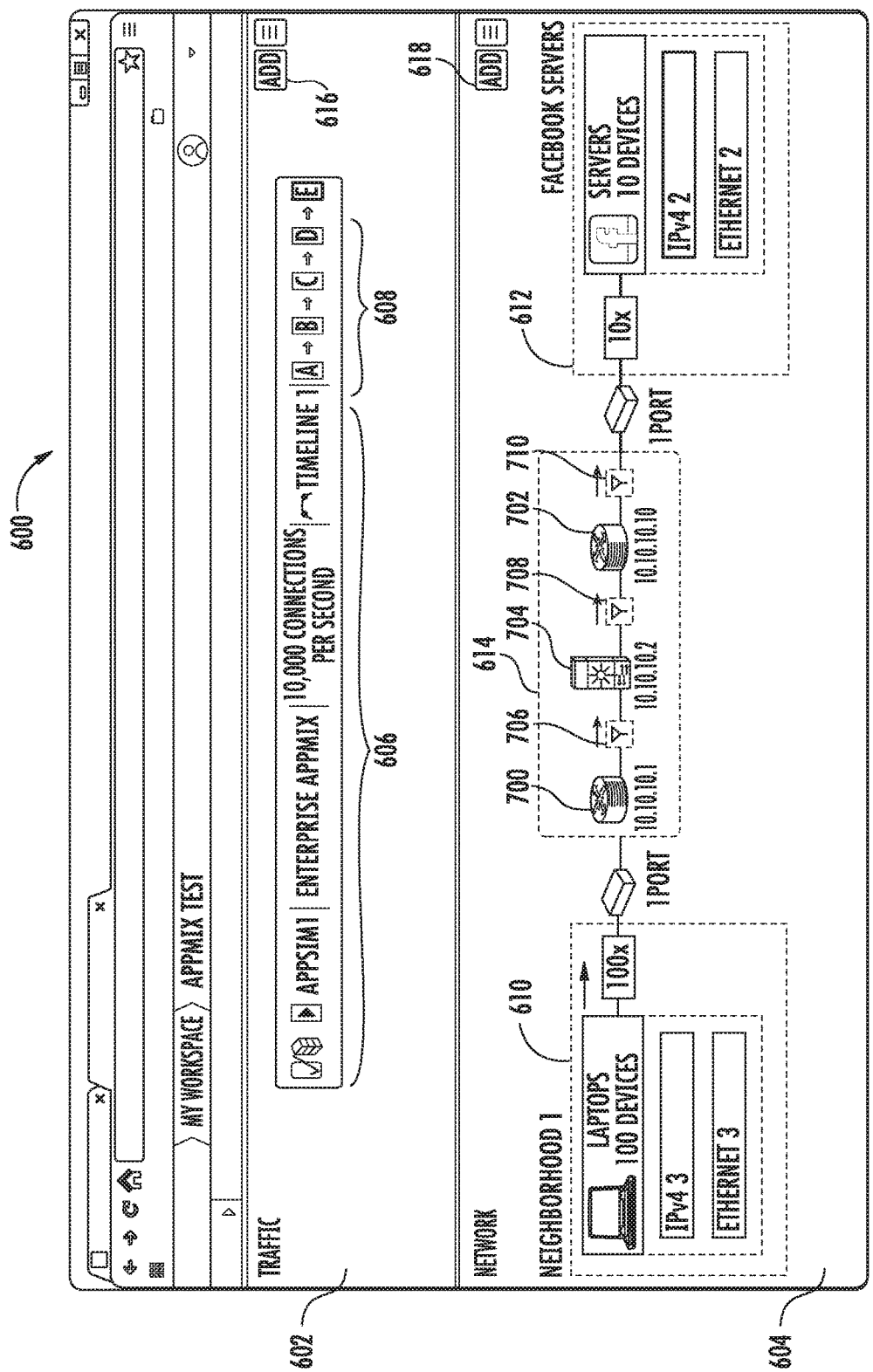

FIGS. 7C-7G illustrate the specification of the traffic source, the traffic destination, and waypoints between the traffic source and destination. Defining a node as a source, destination, or waypoint may include selecting the corresponding letter (A, B, C, D, or E) in traffic definition portion 602 and then selecting the corresponding node in control plane definition and display portion 604 In FIG. 7C, the user selects the traffic source as laptops 610. In FIG. 7D, the user selects the first waypoint, i.e., the first place where traffic is expected as network tap 706. In FIG. 7E, the user selects the next waypoint where traffic is expected, which is network tap 708. In FIG. 7F, the user selects the next waypoint where traffic is expected, which in this example is network tap 710. In FIG. 7G, the user selects the traffic destination, which in this example is Facebook servers 612.

Figure 8A:
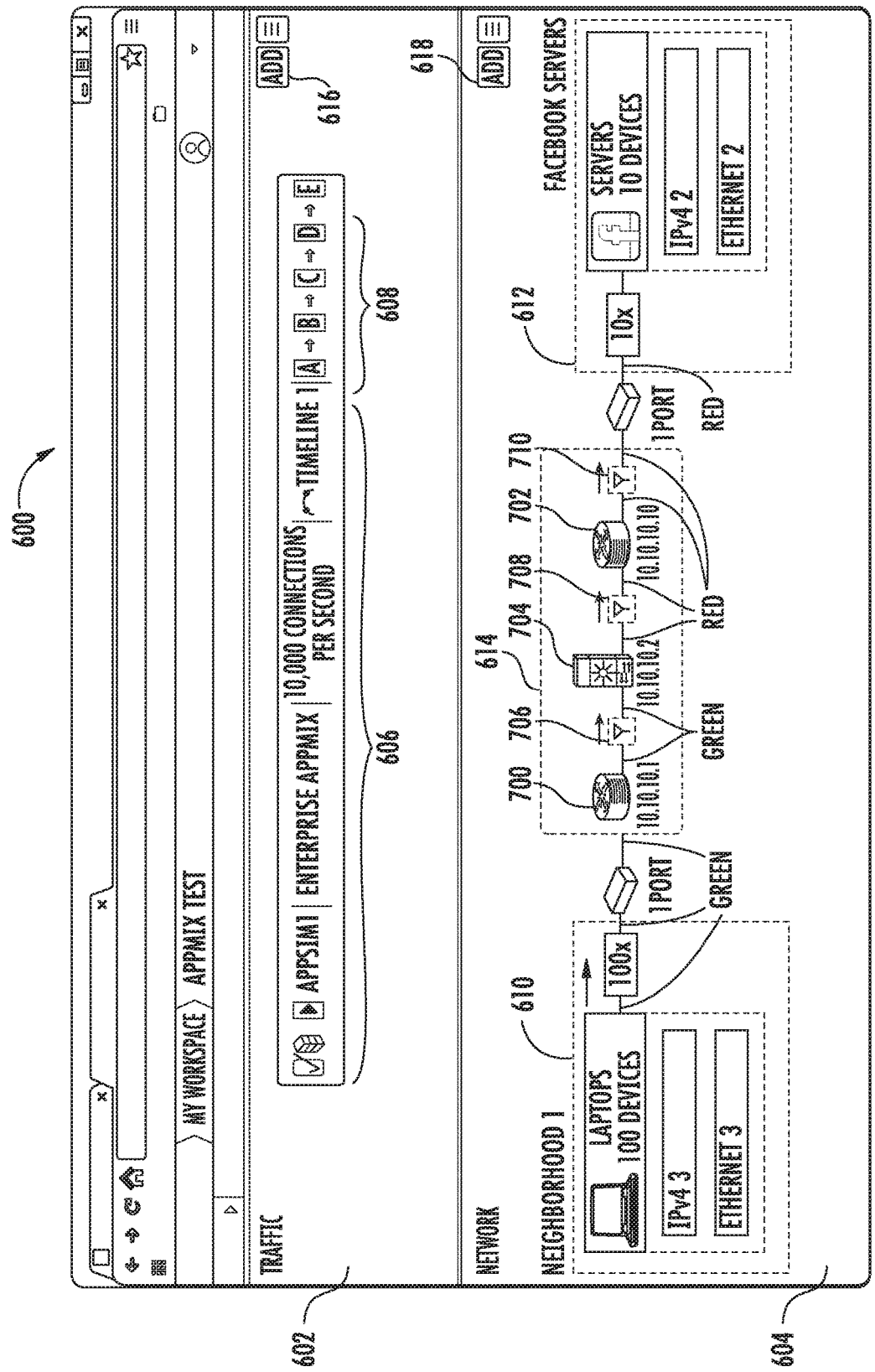
FIG. 8A-8C are computer screen shots of the interface illustrated in FIGS. 6A-6C where measurements from the test are mapped to different portions of a displayed topology map of the system under test according to an embodiment of the subject matter described herein.
Figure 8B:
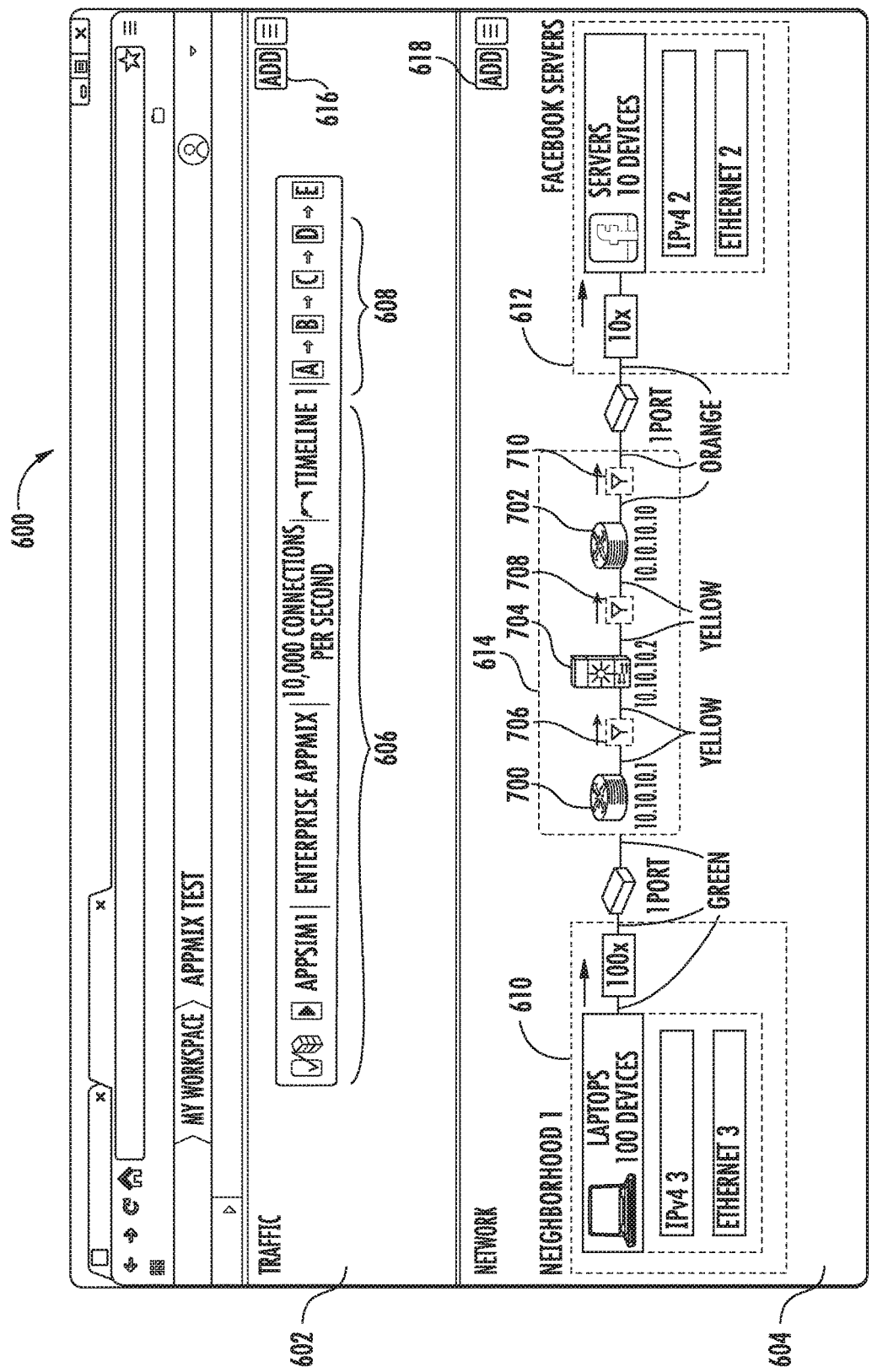
Figure 8C:
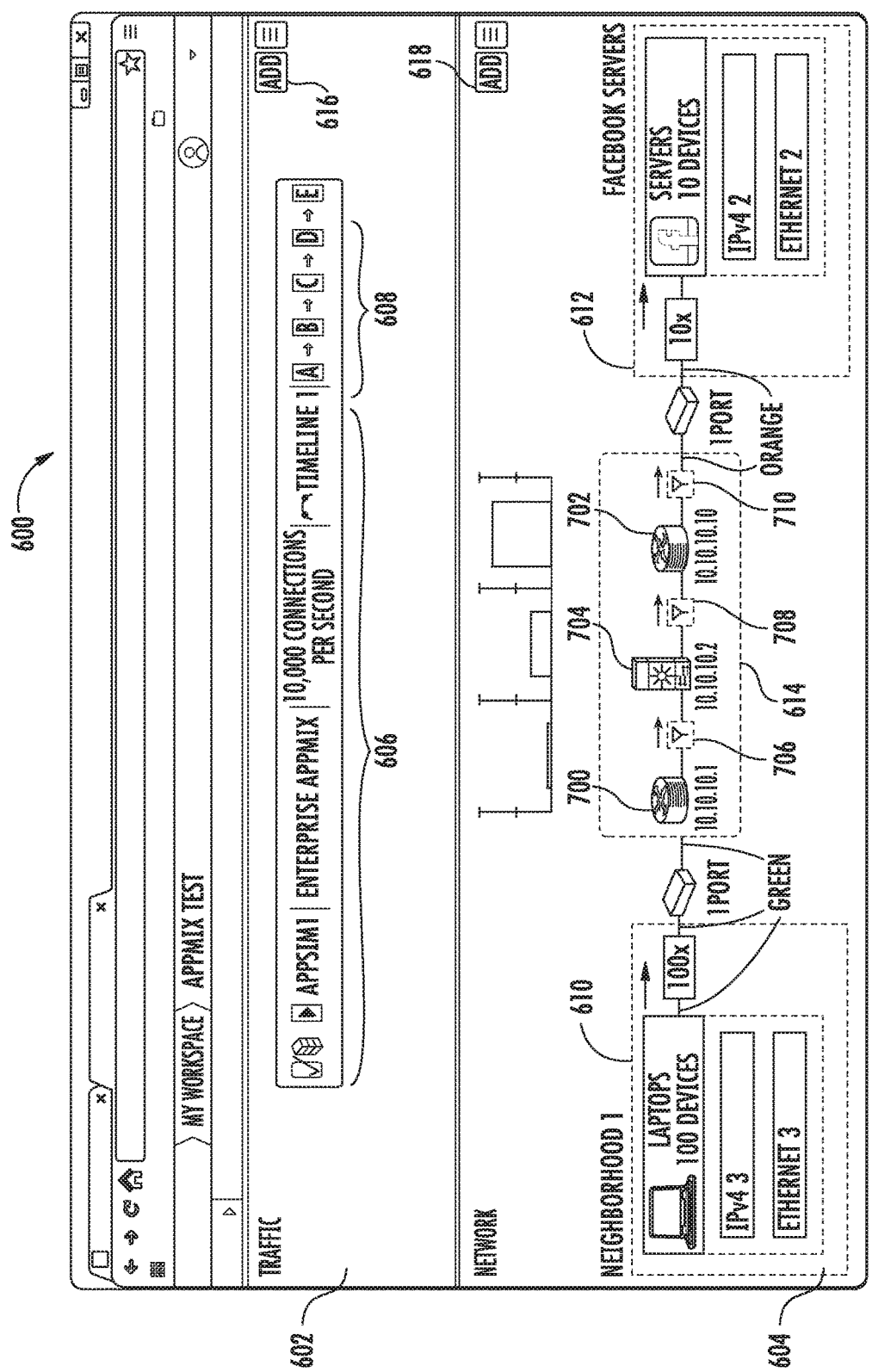

FIGS. 8A-8C illustrate exemplary user interfaces that may be presented to the user while a test is running. In FIG. 8A, traffic is running from the traffic source to the traffic destination. The links may be displayed in different colors to indicate different conditions. These colors are indicated by the words "RED", "GREEN", "ORANGE" and "YELLOW" in FIGS. 8A-8C to obviate the need for color drawings. The green links between nodes indicate traffic running at an expected rate. The red links between the nodes indicate increased latency or packet loss. In the illustrated example, the green links on one side of router 704 and the red links on the other side of router 704 indicate a problem with router 704. In FIG. 8B, the links are displayed with different colors to indicate relative packet loss or latency between network nodes. For example, yellow, orange, and red may indicate relative degrees of packet latency in the network. FIG. 8C illustrates an alternate mechanism for displaying latency where a graph is displayed above each link indicating the relative packet latency of the links. In one embodiment, each segment of each link may be displayed in a different color according to its relative latency, packet loss, throughput, jitter, or other performance metric.

Figure 9:
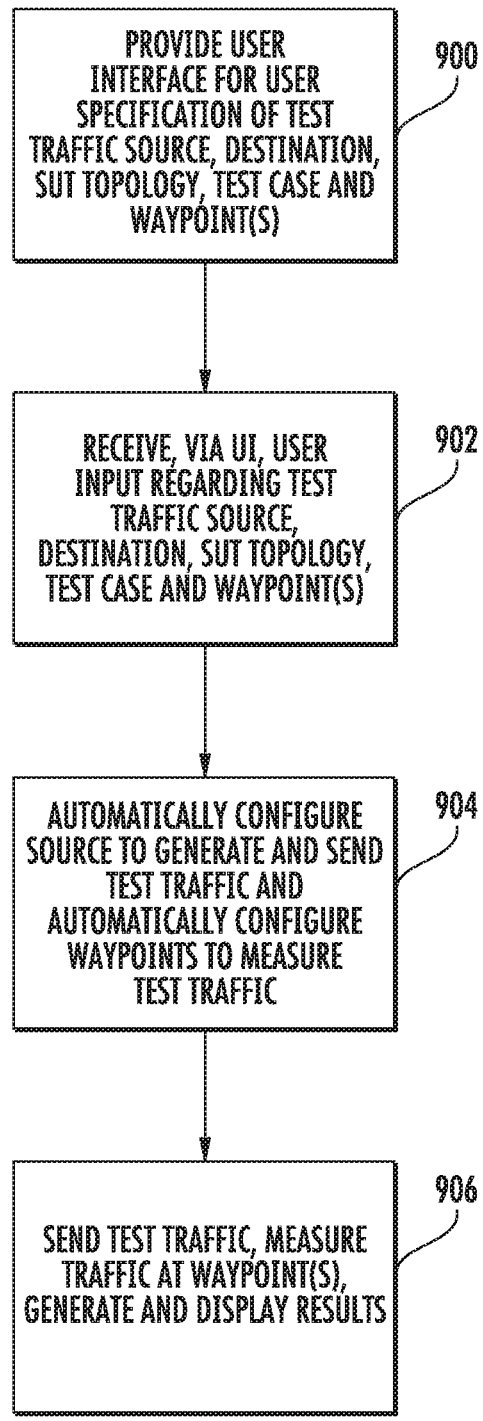
FIG. 9 is a flow chart illustrating an exemplary process for providing user interfaces for specification of system under test and network tap topology and for presenting topology specific test results according to an embodiment of the subject matter described herein.

FIG. 9 is a flow chart illustrating an exemplary process for providing user interfaces for specification of system under test and network tap topology and for presenting topology specific test results according to an embodiment of the subject matter described herein. Referring to FIG. 9, in step 900, a user interface is provided for user specification of a test traffic source, a test traffic destination, a test case, SUT topology, and at least one waypoint in the SUT for measuring test traffic. The user interface may be any of those interfaces illustrated in FIGS. 6A-7G. In step 902, the method includes receiving, via the user interface, user input regarding the test traffic source, the test traffic destination, the test case, the SUT topology, and the at least one waypoint. For example, using interface 600 illustrated in FIG. 6A, the user may define the traffic type, the traffic source, and the traffic destination. The use may further specify the SUT topology using the interface illustrated in FIGS. 7A-7G.

In step 904, in response to the user input, the test traffic source is automatically configured to generate the test traffic and send the test traffic to the traffic destination via the system under test and the waypoints are automatically configured to measure the test traffic. Automatically configuring the test traffic source to transmit the traffic may include configuring a packet generator with the type and volume of traffic to be sent. Automatically configuring the waypoints to measure the traffic may include programming the waypoints to look for the specific traffic type that is of interest to the user by specifying information, such as packet group identifiers (PGIDs) that are of interest. In step 906, the test traffic is generated and sent from the traffic source to the traffic destination via the at least one waypoint and the SUT, the traffic is measured at the at least one waypoint, and measurements of the traffic mapped to different regions of a displayed topology map of the system under test is output.

Measuring and outputting the results may include capturing the traffic that is of interest at the waypoints and presenting results that are mapped to the SUT topology, such as packet loss or latency mapped to links or DUTs, as illustrated in FIGS. 8A-8C.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for specifying and utilizing system under test (SUT) topology information, the method comprising:
   at a network equipment test device:
   providing a user interface for user specification of a test traffic source, a test traffic destination, a test case, an SUT topology, and at least one waypoint for measuring test traffic, wherein the least one waypoint comprises a location of at least one network tap comprising a device that passively copies packets transmitted through a network while allowing original packets to proceed to their destinations, wherein providing a user interface includes providing a graphical user interface that displays network devices that make up the SUT topology and a plurality of network taps that tap network traffic at different locations between the network devices that make up the SUT topology;
   receiving, via the graphical user interface, user input regarding the test traffic source, the test traffic destination, the test case, and the SUT topology, and for defining the at least one waypoint as at least one network tap; and
   in response to the user input, automatically configuring the test traffic source to generate the test traffic and send the test traffic to the test traffic destination via the SUT, and automatically configuring the at least one waypoint as the at least one network tap;
   generating and sending the test traffic from the traffic source to the test traffic destination via the SUT and the at least one waypoint;
   measuring the test traffic at the at least one network tap; and
   outputting, on a topology map of the SUT, an indication of the measured test traffic mapped to different regions of the topology map of the SUT.

2. The method of claim 1 wherein providing a user interface includes providing a user interface having a traffic definition portion which provides for user specification of a traffic type.

3. The method of claim 2 wherein the traffic definition portion provides for user specification of a traffic rate.

4. The method of claim 3 wherein the traffic definition portion provides for user specification of a traffic timeline indicating a time for reaching the traffic rate.

5. The method of claim 2 wherein the traffic definition portion provides for user specification of the traffic source, the traffic destination, and the at least one waypoint.

6. The method of claim 1 wherein providing a user interface includes providing a user interface having a control plane definition and display portion that provides for graphical definition and display of network topology, system under test topology, and tap topology.

7. The method of claim 1 wherein outputting measurements of the traffic on the topology map includes outputting packet loss data mapped to specific links or DUTs on the topology map.

8. The method of claim 1 wherein outputting the measurements mapped to different regions of the topology map includes outputting packet latency data mapped to different links or DUTs on the topology map.

9. The method of claim 1 wherein outputting the measurements mapped to different regions of the topology map includes color-coding links or DUTs to indicate relative traffic measurements.

10. The method of claim 1 wherein outputting the measurements mapped to different regions of the displayed topology map includes displaying a graph of relative measurements associated with different links or DUTs on the topology map.

11. A system for specifying and utilizing system under test (SUT) topology information, the system comprising:
   a network equipment test device including:
   a SUT topology specifier configured to provide a graphical user interface for user specification of a test traffic source, a test traffic destination, and a test case, and for defining at least one waypoint for as at least one network tap, the SUT topology specifier for automatically configuring the test traffic source to generate test traffic and send the test traffic to the system under test, and for automatically configuring the at least one waypoint to as the at least one network tap, wherein the least one waypoint comprises a location of at least one network tap comprising a device that passively copies packets transmitted through a network while allowing original packets to proceed to their destinations, wherein the graphical user interface displays network devices that make up the SUT topology and a plurality of network taps that tap network traffic at different locations between the network devices that make up the SUT topology;
   a test packet generator configured to function as the test traffic source by generating and transmitting the test traffic to the test traffic destination via the SUT and the at least one waypoint; and
   a traffic measurements processor configured to process measurements of the test traffic generated by the at least one network tap and for outputting, on a topology map of the system under test, an indication of the traffic measurements mapped to different regions of the topology map of the system under test.

12. The system of claim 11 wherein the user interface includes a traffic definition portion which provides for user specification of a traffic type.

13. The system of claim 12 wherein the traffic definition portion provides for user specification of a traffic rate.

14. The system of claim 13 wherein the traffic definition portion provides for user specification of a traffic timeline indicating a time for reaching the traffic rate.

15. The system of claim 12 wherein the traffic definition portion provides for user specification of the traffic source, the traffic destination, and the at least one waypoint.

16. The system of claim 11 wherein the user interface includes a control plane definition and display portion that provides for graphical definition and display of network topology, system under test topology, and tap topology.

17. The system of claim 11 wherein traffic measurements processor is configured to output packet loss data mapped to specific links or DUTs on the topology map.

18. The system of claim 11 wherein the traffic measurements processor is configured to output packet latency data mapped to different links or DUTs on the topology map.

19. The system of claim 11 wherein the traffic measurements processor is configured to color-code links or DUTs to indicate relative traffic measurements.

20. The system of claim 11 wherein the traffic measurements processor is configured to display a graph of relative traffic measurements associated with different links or DUTs on the topology map.

21. A non-transitory computer readable medium having stored thereon executable instructions that when executed by the processor of a computer control the computer to perform steps comprising:

providing a user interface for user specification of a test traffic source, a test traffic destination, a test case, an SUT topology, and at least one waypoint for measuring test traffic, wherein the at least one waypoint comprises a location of at least one network tap comprising a device that passively copies packets transmitted through a network while allowing original packets to proceed to their destinations, wherein providing a user interface includes providing a graphical user interface that displays network devices that make up the SUT topology and a plurality of network taps that tap network traffic at different locations between the network devices that make up the SUT topology;

receiving, via the graphical user interface, user input regarding the test traffic source, the test traffic destination, the test case, and the SUT topology, and for defining the at least one waypoint as at least one network tap; and in response to the user input, automatically configuring the test traffic source to generate the test traffic and send the test traffic to the test traffic destination via the SUT, and automatically configuring the at least one waypoint as the at least one network tap;

generating and sending test traffic from the traffic source to the traffic destination via the SUT and the at least one waypoint;

measuring the test traffic at the at least one network tap; and outputting, on a topology map of the SUT, an indication of the measured traffic mapped to different regions of the displayed topology map of the SUT.

* * * * *